United States Patent
Wang et al.

(10) Patent No.: US 11,019,723 B2
(45) Date of Patent: May 25, 2021

(54) STRETCHABLE ELECTRODE, ELECTRONIC DEVICE AND MANUFACTURING METHOD THEREOF

(71) Applicants: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

(72) Inventors: Tao Wang, Kunshan (CN); Xuna Li, Kunshan (CN); Feng Zhai, Kunshan (CN); Songlin Jia, Kunshan (CN); Weigao Cheng, Kunshan (CN); Yalei Ren, Kunshan (CN)

(73) Assignees: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 0 days.

(21) Appl. No.: 16/852,577

(22) Filed: Apr. 20, 2020

(65) Prior Publication Data

US 2020/0281075 A1 Sep. 3, 2020

Related U.S. Application Data

(63) Continuation of application No. PCT/CN2019/079736, filed on Mar. 26, 2019.

(30) Foreign Application Priority Data

Sep. 19, 2018 (CN) .......................... 201821533812.2

(51) Int. Cl.
*H05K 1/02* (2006.01)

(52) U.S. Cl.
CPC .................................. *H05K 1/0283* (2013.01)

(58) Field of Classification Search
CPC .. H05K 1/0283; H05K 1/0284; H05K 1/0277; H05K 1/0278; H05K 1/028; H05K 1/0281
See application file for complete search history.

(56) References Cited

U.S. PATENT DOCUMENTS

2009/0283891 A1* 11/2009 Dekker ................ H05K 1/0283
                                                                257/690
2009/0317639 A1* 12/2009 Axisa ................... H05K 1/0283
                                                                428/411.1

(Continued)

FOREIGN PATENT DOCUMENTS

| CN | 104377205 A | 2/2015 |
|----|-------------|--------|
| CN | 104485345 A | 4/2015 |

(Continued)

OTHER PUBLICATIONS

Search Report of International Application No. PCT/CN2019/079736.

(Continued)

*Primary Examiner* — Hoa C Nguyen
(74) *Attorney, Agent, or Firm* — Kilpatrick Townsend & Stockton LLP (57) ABSTRACT

The present application discloses a stretchable electrode, an electronic device and a manufacturing method thereof. The stretchable electrode includes a substrate, an electric conductive area and an electronic device integration area; the substrate has a first elastic layer and a second elastic layer with different elastic moduli. The electronic device produced by using the afore-mentioned stretchable electrode can be stretched entirely, and when it is stretched, the electronic (Continued)

device would not be damaged and the variation of its impedance is small. Tests have shown that the electric conductive layer can be stretched by more than 20%, with the variation ratio of its impedance being less than 1.5%, and no damage is caused to the electronic device.

20 Claims, 4 Drawing Sheets

(56) References Cited

U.S. PATENT DOCUMENTS

| | | | |
|---|---|---|---|
| 2010/0120205 A1 | 5/2010 | Maruyama et al. | |
| 2016/0162774 A1* | 6/2016 | Mei | G06K 19/07722 |
| | | | 235/488 |
| 2016/0359135 A1 | 12/2016 | Wang et al. | |
| 2020/0281074 A1* | 9/2020 | Okimoto | H05K 3/0014 |

FOREIGN PATENT DOCUMENTS

| | | |
|---|---|---|
| CN | 106684115 A | 5/2017 |
| CN | 106923816 A | 7/2017 |

OTHER PUBLICATIONS

Written Opinion of International Application No. PCT/CN2019/079736.
First Office Action of Chinese Application No. 201821533812.2.

* cited by examiner

STRETCHABLE ELECTRODE, ELECTRONIC DEVICE AND MANUFACTURING METHOD THEREOF

CROSS-REFERENCES TO RELATED APPLICATIONS

The present application is a continuation of International Application No. PCT/CN2019/079736, filed on Mar. 26, 2019, which claims priority to Chinese Patent Application No. 201821533812.2, filed on Sep. 19, 2018. Both applications are incorporated by reference herein in their entireties for all purposes.

TECHNICAL FIELD

The present application belongs to the technical field of electronic devices.

BACKGROUND

Along with the development of flexible electronic devices, new characteristic demands for the display technology have been raised with respect to different application scenes, wherein the stretchable display technology and the flexible sensing technology are both hotspots of the current researches. In a flexible electronic device, there is a demand for realizing flexible stretch and integrating functional devices, but the functional devices cannot be stretched or bent.

SUMMARY

A technical problem to be solved by the present application is the defects of poor stretching performance and low electrical stability in the manufacturing process of flexible electronic devices, and the present application provides a stretchable electrode and an electronic device.

In order to solve the above technical problem, the present application adopts the following technical solution:

The stretchable electrode provided by the present application comprises a substrate, having a first elastic layer, and a second elastic layer positioned on the first elastic layer and having an elastic modulus greater than that of the first elastic layer;

an electric conductive area formed on one side of the second elastic layer away from the first elastic layer; and an electronic device integration area formed on one side of the second elastic layer away from the first elastic layer.

Optionally, the electric conductive area has a curved shape with an electric conductive layer arranged therein, and the electric conductive layer has a curved arrangement in the electric conductive area.

Optionally, the second elastic layer is made of material including at least one of polyimide (PI), polycarbonate (PC), polymethyl methacrylate (PMMA) and polyethylene terephthalate (PET).

Optionally, the second elastic layer has a thickness range from 5 µm to 30 µm.

Optionally, the electric conductive layer is a metal wire having a width equal to that of the electric conductive area.

Optionally, the metal wire comprises rectilinear segments and a curvilinear segment; the curvilinear segment is connected between neighboring rectilinear segments, and the curvilinear segment comprises at least one U-shaped structure.

Optionally, when the curvilinear segment comprises two or more U-shaped structures, two neighboring U-shaped structures have opposite protruding directions.

Optionally, the electric conductive layer has a thickness range from 100 nm to 2 µm.

Optionally, the stretchable electrode further comprises an insulating layer, provided on the electric conductive layer, covering the electric conductive layer, and having welding through-holes provided therein; a welding pad, formed on the insulating layer, filled in the welding through-holes, and connected to the electric conductive layer.

Optionally, the electric conductive area and the electronic device integration area are both formed on the substrate, and the electric conductive area has a zone overlapping the electronic device integration area.

Optionally, the electric conductive area is partially formed on the substrate, and the electronic device integration area is entirely formed on the substrate.

Optionally, the part of the electric conductive area formed on the substrate is a zone where the electric conductive area overlaps the electronic device integration area.

Optionally, the electronic device integration area is formed as a first groove provided on the substrate; the electric conductive area is formed as a second groove having a curved shape; and the second groove intersects with the first groove and has a groove bottom lower than that of the first groove.

Optionally, the metal wire has a width smaller than that of the substrate.

Optionally, the electronic device integration area is located at a location where the rectilinear segments of two of the metal wires intersect with each other.

Optionally, the two rectilinear segments at the location of intersection are made of the same metal.

Optionally, the electronic device integration area has a square shape.

Optionally, the electric conductive layer is a metal electric conductive layer.

Optionally, the metal electric conductive layer is a copper layer, a titanium-copper layer, a gold layer, or an aluminum layer, etc.

Optionally, the welding pad is a tin (Sn) layer, an Indium (In) layer or a gold (Au) layer.

Furthermore, the present application also provides an electronic device that comprises the afore-mentioned stretchable electrode.

Optionally, the electric conductive area has a curved shape with an electric conductive layer arranged therein, and the electric conductive layer has a curved arrangement in the electric conductive area.

Optionally, an electronic device body is integrated in the electronic device integration area and is in contact with the electric conductive layer; and the electronic device further comprises a third elastic layer, covering on the electronic device body and being in contact with the first elastic layer or the second elastic layer, so as to encapsulate the electronic device body.

Optionally, the electronic device body is a photoelectric device or a sensor.

Optionally, the electronic device body is a sensor chip, an LED or a Micro LED.

Optionally, the third elastic layer has a thickness range from 50 µm to 500 µm.

Optionally, the first elastic layer and the third elastic layer are thermoplastic urethane (TPU) elastomer or silicon rubber.

The present application also provides a method for manufacturing an electronic device, comprising the following steps:

providing a substrate comprising a first elastic layer and a second elastic layer which is positioned on the first elastic layer and has an elastic modulus greater than that of the first elastic layer;

coating a photoresist layer on the substrate, and performing developing by light-exposure for patterning;

depositing a metal layer;

stripping the photoresist layer to make the metal layer form a pattern;

patterning the substrate to form an electric conductive area and an electronic device integration area, both of which are formed on one side of the second elastic layer away from the first elastic layer.

Optionally, the electric conductive area has a curved shape with an electric conductive layer arranged therein, and the electric conductive layer has a curved arrangement in the electric conductive area.

The technical solution provided by the present application has the following advantages:

A stretchable electrode is provided and comprises a substrate comprising a first elastic layer, and a second elastic layer disposed on the first elastic layer and having an elastic modulus greater than that of the first elastic layer; an electric conductive area, formed on one side of the second elastic layer away from the first elastic layer; and an electronic device integration area, formed on one side of the second elastic layer away from the first elastic layer. In a stretching process of the stretchable electrode provided in the aforementioned technical solution, because the elastic modulus of the second elastic layer is greater than the elastic modulus of the first elastic layer, the deformation of the second elastic layer would be smaller than the deformation of the first elastic layer, so that the electronic units in the electronic device integration area would not easily be damaged, and high electrical stability of the stretchable electrode is ensured; meanwhile, as the deformation of the first elastic layer is larger than the deformation of the second elastic layer, the stretchable electrode has good stretching performance.

The electric conductive area has a curved shape with an electric conductive layer arranged therein, and the electric conductive layer has a curved arrangement in the electric conductive area. Wherein, the electric conductive area is configured to have a curved shape for arranging the curved electric conductive layer, and because the curved shape has a buffering effect, the stretching effect of the stretchable electrode can be increased, meanwhile, the electronic units in the electronic device integration area can be prevented from being damaged. Therefore, the stretchable electrode can ensure that the electronic device can be stretched entirely, and when it is stretched, the electronic device would not be damaged and the variation of its impedance is small. Tests have shown that the electric conductive layer can be stretched by more than 20%, with the variation ratio of its impedance being less than 1.5%, and no damage is caused to the electronic device.

The electric conductive area and the electronic device integration area are both formed in predetermined areas on the substrate, which would not damage or affect the structure of the substrate.

The metal wire has a width smaller than that of the substrate, which is beneficial for encapsulating the metal wire and preventing the side wall of the metal wire from being oxidized.

The metal wire comprises rectilinear segments and a curvilinear segment, the curvilinear segment is connected between neighboring rectilinear segments, and the curvilinear segment comprises at least one U-shaped structure; or, when the curvilinear segment comprises two or more U-shaped structures, two neighboring U-shaped structures have opposite protruding directions. The electronic device integration area is located at a location where the rectilinear segments of two of the metal wires intersect each other; meanwhile, the two rectilinear segments at the location of intersection are made of the same metal, such as copper. The metal wires at a connection point of the metal wires connecting to the electronic device are made of the same metal, such as copper, so they can be manufactured in the same layer and patterned; the portion of the metal wire at the connection point is a rectilinear segment, and the portion of the metal wire between electronic devices comprises a U-shaped or horseshoe curvilinear segment, so that the electronic device is uniformed stressed when being stretched, which is beneficial for improving the stretching performance.

The electronic device connection point and the wire are patterned, wherein the bonding zone for the electronic device is arranged to have a square shape, so that, while the entire structure can be stretched, the non-stretchable area has a compact structure and a small area ratio.

An insulating layer that covers the electric conductive layer is provided on the electric conductive layer, for protecting the electric conductive layer.

BRIEF DESCRIPTION OF THE DRAWINGS

In order to more clearly describe the technical solutions in the specific embodiments of the present application or in the prior art, hereinafter, the accompanying drawings used for describing the specific embodiments or the prior art will be briefly introduced. Apparently, the accompanying drawings described below are only some embodiments of the present application, and for a person with ordinary skill in the art, without expenditure of creative labor, other drawings can be derived from these accompanying drawings.

DETAILED DESCRIPTION OF THE INVENTION

A clear and complete description of the technical solution of the present application is given below. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

In addition, the technical features involved in different embodiments of the present invention described below may be combined with one another as long as they do not conflict with one another.

In consideration of the problem that, in a manufacturing process of flexible electronic devices, while the space size is limited, a stretching function needs to be realized based on integration of non-deformable functional devices, and in consideration of the problem that, because electronic devices are integrated therein, when entirely stretched and deformed, the electrical performance of the electronic devices needs to have little variation of impedance, the present application provides a stretchable electrode and an electronic device, and the specific embodiments thereof are as follows:

Embodiment 1

Figure 1:
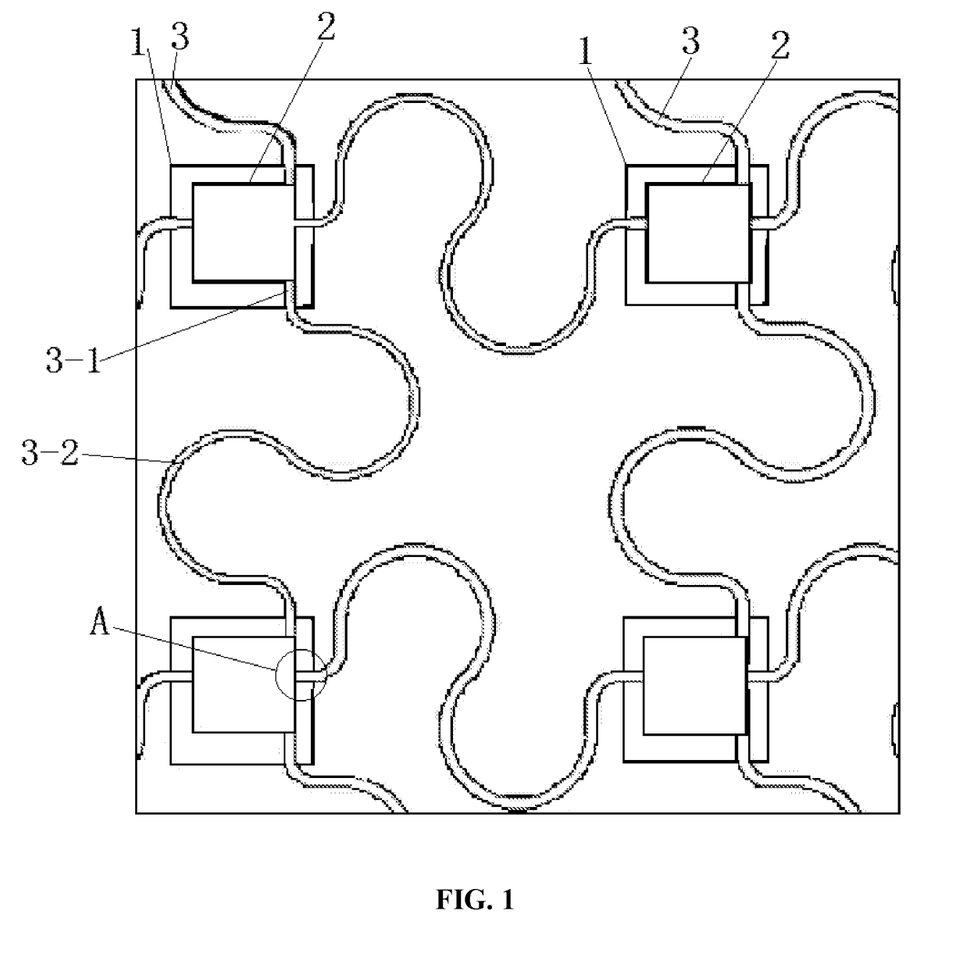
FIG. 1 is a structural schematic diagram of an electronic device in an embodiment of the present application.
Figure 2:
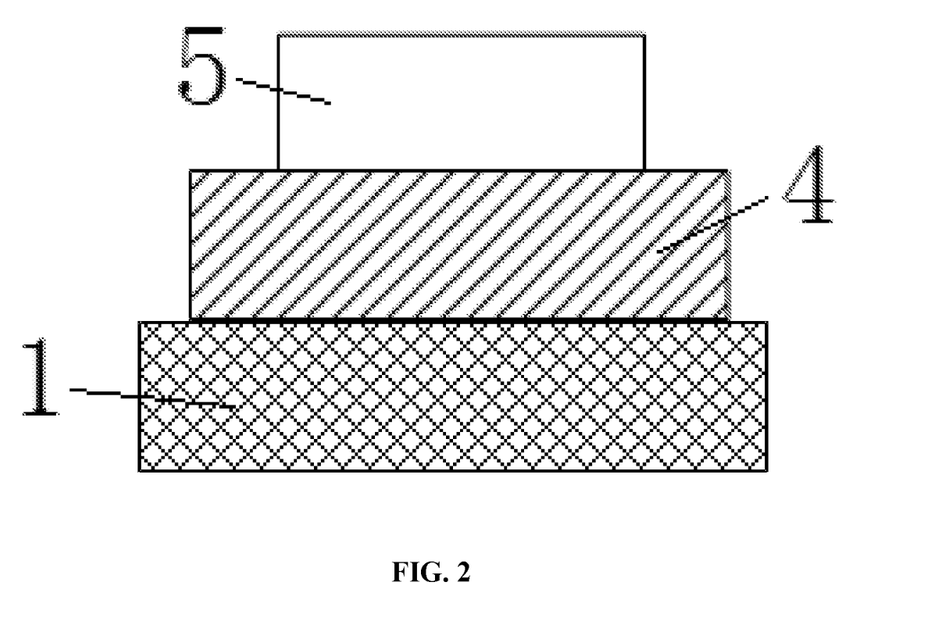
FIG. 2 is a structural schematic diagram of a cross-section at the location A in FIG. 1.

The present embodiment provides a stretchable electrode, as shown in FIG. 1 and FIG. 2, the stretchable electrode comprises a substrate 1, an electric conductive area 3 and an electronic device integration area 2, and the substrate 1 may comprise two layers of materials with different rigidity. Wherein, the layer adjacent to the electric conductive area 3 is a second elastic layer 12, and the second elastic layer 12 is made of a material having greater elastic deformation, which means larger rigidity, such as at least one selected from polyimide (PI), polycarbonate (PC), polymethyl methacrylate (PMMA) and polyethylene terephthalate (PET), and preferably polyimide (PI). The layer of the substrate 1 away from the electric conductive area 3 is a first elastic layer 11, and the first elastic layer 11 is made of a material having larger elastic deformation, which means smaller rigidity, such as thermoplastic polyurethane elastomer (TPU) or silicon rubber.

In a stretching process of the stretchable electrode, because the elastic modulus of the second elastic layer is greater than the elastic modulus of the first elastic layer, the deformation of the second elastic layer would be smaller than the deformation of the first elastic layer, so that the electronic units in the electronic device integration area would not easily be damaged, and high electrical stability of the stretchable electrode is ensured; meanwhile, as the deformation of the first elastic layer is larger than the deformation of the second elastic layer, the stretchable electrode has good stretching performance.

As an optional embodiment, the second elastic layer has a thickness of 5 μm-30 μm, for example, 10 μm, 15 μm, 20 μm, 25 μm. The electric conductive area 3 and the electronic device integration area 2 are both formed on the substrate 1, and the electric conductive area 3 has a zone overlapping the electronic device integration area 2. Wherein, the electric conductive area 3 may partially overlap the electronic device integration area 2, or the electric conductive area 3 may entirely overlap the electronic device integration area 2. Specifically, the electric conductive area 3 may be a square-shaped electric conductive area.

Further optionally, the electric conductive area 3 has a curved shape with an electric conductive layer 4 arranged therein, and the electric conductive layer 4 has a curved arrangement in the electric conductive area 3. Specifically, the electric conductive layer 4 is a metal electric conductive layer having a thickness of 100 nm-2 μm, for example, 200 nm, 500 nm, 800 nm, 1 μm, 1.5 μm. This metal electric conductive layer is a copper layer, a titanium-copper layer, a gold layer, or an aluminum layer, etc. Wherein, the electric conductive area 3 is configured to have a curved shape for arranging the curved electric conductive layer 4, and because the curved shape has a buffering effect, the stretching effect of the stretchable electrode can be increased, meanwhile, the electronic units in the electronic device integration area can be prevented from being damaged.

The stretchable electrode comprises the substrate 1, the electric conductive area 3 and the electronic device integration area 2, wherein the electric conductive area 3 and the electronic device integration area 2 are both formed on the substrate 1, and the electric conductive area 3 has a zone overlapping the electronic device integration area 2, the electric conductive area 3 has a curved shape with an electric conductive layer 4 arranged therein, and the electric conductive layer 4 has a curved arrangement in the electric conductive area. In an electronic device produced by using the afore-mentioned stretchable electrode, an independent stretchable structure is formed by the substrate 1 together with patterned metal (such as the electric conductive layer 4 having a curved arrangement in the electric conductive area 3), and the independent stretchable structure can be stretched entirely, and when it is stretched, the electronic device would not be damaged and the variation of its impedance is small. Tests have shown that the electric conductive layer can be stretched by more than 20%, with the variation ratio of its impedance being less than 1.5%, and there is no damage to the electronic device. Meanwhile, as shown in FIG. 1 and FIG. 2, the stretchable electrode has a high degree of integration and strong flexibility, the design shape of the electric conductive layer 4 (such as a conductive wire) and the substrate shape at the bonding location of the electronic device body 5 can be varied according to demands, so that electronic devices with a size of hundreds of microns can be integrated.

Specifically, in the present embodiment, the electric conductive area 3 and the electronic device integration area 2 are just formed in predetermined areas on the substrate 1, which would not damage or affect the structure of the substrate 1.

Embodiment 2

The present embodiment provides a stretchable electrode, on the basis of the above Embodiment 1, the electric conductive area is a metal wire, and the metal wire has a width equal to that of the electric conductive area. Wherein, by arranging the electric conductive area to be a metal wire, the purpose of realizing easy distribution and increasing the degree of integration as greatly as possible over a limited size can be achieved.

Optionally, the width of the metal wire is smaller than that of the substrate 1, which is beneficial for encapsulating the metal wire and preventing the side wall of the metal wire from being oxidized.

Embodiment 3

The present embodiment provides a stretchable electrode, on the basis of the above Embodiment 2, the metal wire comprises rectilinear segments 3-1 and curvilinear segments 3-2, the curvilinear segments 3-2 are respectively connected between neighboring rectilinear segments 3-1, and each curvilinear segment 3-2 comprises at least one U-shaped structure. Wherein, when the curvilinear segment 3-2 comprises two or more U-shaped structures, two neighboring U-shaped structures have opposite protruding directions. As shown in FIG. 1, the electronic device integration area 2 is located at a location where the rectilinear segments of two of the metal wires intersect each other. Meanwhile, the two rectilinear segments at the location of intersection are made of the same metal, such as copper.

By the above arrangement, the metal wires at a connection point of the metal wires connecting to the electronic device are made of the same metal, such as copper, so the metal wires at the connection point of the metal wires connecting to the electronic device can be manufactured in the same layer and patterned at the same time. The portions of the metal wire at the connection points are rectilinear, and the portions of the metal wire between electronic devices are U-shaped, with two neighboring U-shapes thereof having opposite protruding directions, so that the electronic device is uniformed stressed when being stretched, which is beneficial for improving the stretching performance.

Meanwhile, the electronic device connection point and the metal wire are patterned, wherein the bonding zone for the electronic device is arranged to have a square shape, so that, while the entire structure can be stretched, the non-stretchable area has a compact structure and a small area ratio.

Furthermore, the electronic device integration area 2 is entirely formed on the substrate 1, and the electric conductive area 3 is only partially formed on the substrate 1. More specifically, the part of the electric conductive area 3 formed on the substrate 1 is a zone where the electric conductive area 3 overlaps the electronic device integration area 2.

Embodiment 4

The present embodiment provides a stretchable electrode, on the basis of the above Embodiments 1, 2 or 3, in order to protect the electric conductive layer 4, for example, a metal wire, the electronic device body is integrated on the substrate 1, and the stretchable electrode also comprises an insulating layer which is provided on the electric conductive layer 4 and covers the electric conductive layer 4, and the insulating layer has welding through-holes provided therein; welding pads are formed on the insulating layer and are filled in the welding through-holes, so as to be connected to the electric conductive layer.

Wherein, the insulating layer covers the electric conductive layer 4 for protecting the electric conductive layer 4. The thickness of the insulating layer associated with the electric conductive layer 4 can be selected according to demands, and is normally comparable to the thickness of the electric conductive layer 4. The welding pads are used for welding the electric conductive layer 4 to the electronic device body. Furthermore, the welding pads comprise a tin (Sn) layer, an Indium (In) layer, or a gold (Au) layer, etc.

Furthermore, the stretchable electrode also comprises a base plate, and the substrate 1 is provided on the base plate. Wherein, the base plate may be a glass base plate.

Embodiment 5

The present embodiment provides a stretchable electrode, as an alternative embodiment of the above Embodiments 1, 2, 3 or 4, the electronic device integration area 2 is a first groove provided on the substrate 1, the electric conductive area 3 is a second groove having a curved shape, and the second groove intersects the first groove and has a groove bottom lower than that of the first groove. Thus, the metal wire is distributed in the second groove, and the electronic device body is located in the first groove and above the metal wire.

In this embodiment, the electronic device integration area 2 has a round shape or an oval shape.

In this embodiment, the electronic device integration area 2 is entirely formed on the substrate 1, and the electric conductive area 3 is also entirely formed on the substrate 1, that is to say, the substrate 1 is an integral substrate enough for forming all the electronic device integration areas 2 and the electric conductive areas 3 thereon. More specifically, in order to save the material of the substrate 1, polyimide substrate along the extending direction of the metal wire is provided beneath the metal wire, and the metal wire is positioned upon the polyimide substrate.

Embodiment 6

Figure 3:
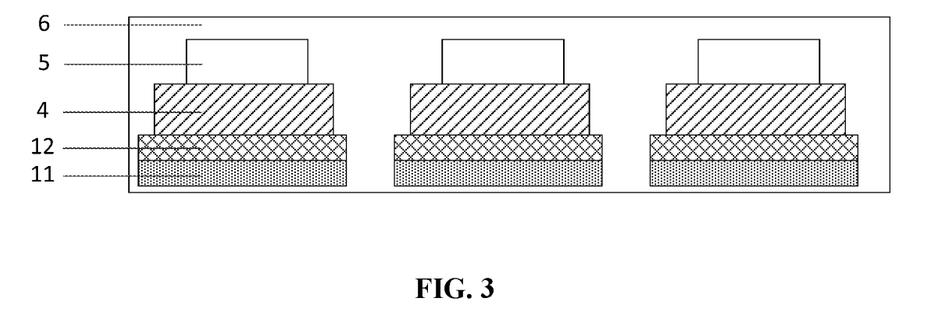
FIG. 3 is an integrated structural view of electronic devices in an embodiment of the present application.

The present embodiment provides an electronic device, as shown in FIG. 3, which uses the stretchable electrode of the afore-mentioned embodiments, each electronic device body 5 is integrated in an electronic device integration area 2 and is in contact with the electric conductive layer 4. Optionally, the electronic device body is a photoelectric device or a sensor, for example, a sensor chip, an LED or a Micro LED.

Furthermore, the electronic device also comprises the first elastic layer 11, the second elastic layer 12 and a third elastic layer 6. There are multiple zones of the second elastic layer 12 provided in the same plane upon the corresponding zones of the first elastic layer 11, and the zones of the first elastic layer 11 have a size different from those of the zones of the second elastic layer 12, the size of each zone of the first elastic layer 11 is larger than the size of the corresponding zone of the second elastic layer 12. Each zone of the second elastic layer 12 corresponds to one electronic device body or multiple electronic device bodies, and herein, the third elastic layer 6 comes in contact with the first elastic layer 11 through gaps between the zones of the second elastic layer 12, so as to encapsulate the electronic device bodies 5. The elastic modulus of the second elastic layer 12 is greater than the elastic modulus of the first elastic layer 11; the third elastic layer 6 covers the electronic device body 5, the first elastic layer 11 covers one side of the second elastic layer 12 away from the electronic device body 5, and the first elastic layer 11 and the third elastic layer 6 are in contact with each other, so as to encapsulate the electronic device bodies 5.

Optionally, the first elastic layer 11 has a thickness of 50 μm-500 μm.

The second elastic layer 12 has a thickness of 5 μm-30 μm.

Optionally, the first elastic layer 11 and the third elastic layer 6 are made of thermoplastic urethane (TPU) elastomer or silicon rubber.

Optionally, the second elastic layer 12 is made of any one of polyimide (PI), polycarbonate (PC), polymethyl methacrylate (PMMA) and polyethylene terephthalate (PET).

Figure 4:
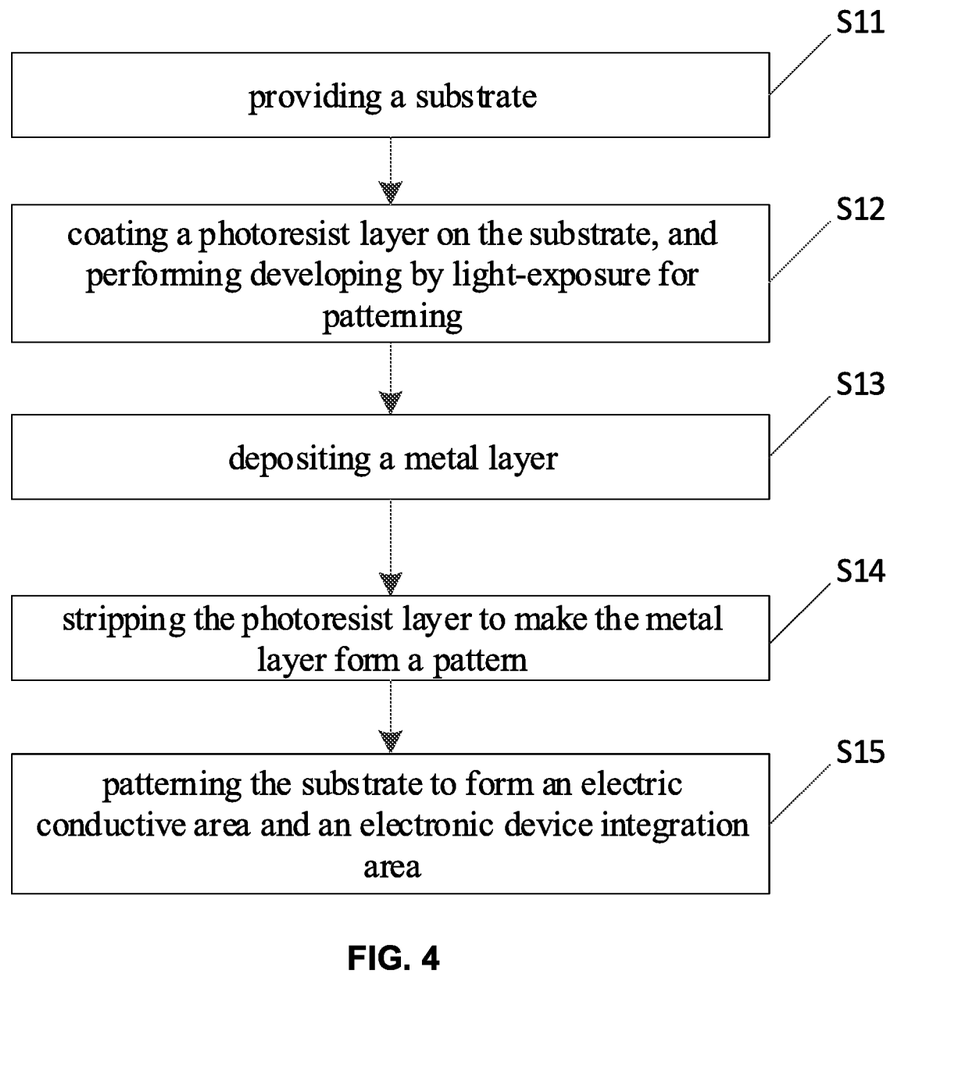
FIG. 4 is a flow chart of a method for manufacturing an electronic device in an embodiment of the present application.

In addition, the present application provides a specific method for manufacturing the electronic device, as shown in FIG. 4, the method comprises the following steps:

S11, providing a substrate.

Wherein, the substrate 1 comprises a first elastic layer 11, and a second elastic layer 12 disposed on the first elastic layer 11 and having an elastic modulus greater than that of the first elastic layer 11.

S12, coating a photoresist layer on the substrate, and performing developing by light-exposure for patterning.

S13, depositing a metal layer.

S14, stripping the photoresist layer to make the metal layer form a pattern.

S15, patterning the substrate to form an electric conductive area and an electronic device integration area; wherein, both the electric conductive area 3 and the electronic device integration area 2 are formed on one side of the second elastic layer 12 away from the first elastic layer.

As an optional implementation way of this embodiment, the electric conductive area 3 formed in the step S15 has a curved shape with an electric conductive layer 4 arranged therein, and the electric conductive layer 4 has a curved arrangement in the electric conductive area 3.

As a specific implementation way of this embodiment, the method for manufacturing the electronic device comprises:

1) preparing a glass base plate.

2) processing the glass base plate to form a transition layer facilitating laser stripping or mechanical stripping.

3) coating a strippable substrate, preferably polyimide (PI), with a thickness of 5-30 μm.

4) coating a photoresist layer, and performing developing by light-exposure for patterning.

5) depositing a metal layer, herein, the metal may be firstly deposited and then patterned, or a lift-off process may be used, the deposited metal layer has a thickness of 100 nm-2 μm.

6) stripping the photoresist layer, so the metal layer forms a pattern.

7) patterning the substrate to form a conductive wire area and an electronic device integration area, preferably by laser processing; an insulating layer may by formed upon the metal layer, for protecting the metal wires.

8) welding the device body, metal material, such as Sn, In, Au, etc., for facilitating the welding may be selectively applied under the device body to be welded, and the device body may be a photoelectric device or a sensor device.

9) forming elastic material upon the device body, by means of casting, scraping, spin coating, etc., and the elastic material may be thermoplastic urethane (TPU), polydimethylsiloxane (PDMS), etc.

10) stripping the substrate, by laser stripping or mechanical stripping.

11) forming elastic material on the back side of the substrate, and the formed elastic material has a thickness of 50 μm-500 μm.

This manufacturing process is simple, the electronic device is entirely wrapped by elastic material, the elastic material may be thermoplastic urethane elastomer, silicon rubber, etc., the conductive wire is not easily damaged, and eventually an integrated structure of the electronic device as shown in FIG. 3 is produced.

Apparently, the afore-mentioned embodiments are merely examples illustrated for giving a clear description, rather than limiting the implementation ways thereof. For a person with ordinary skill in the art, various changes and modifications in other different forms can be made on the basis of the afore-mentioned description. It is unnecessary and impossible to exhaustively list all the implementation ways herein. However, any obvious changes or modifications derived from the afore-mentioned description are intended to be embraced within the protection scope of the present invention application.

The invention claimed is:

1. A stretchable electrode, comprising:
a substrate, having a first elastic layer, and a second elastic layer positioned on the first elastic layer and having an elastic modulus greater than that of the first elastic layer;
an electric conductive area formed on one side of the second elastic layer away from the first elastic layer; and
an electronic device integration area formed on one side of the second elastic layer away from the first elastic layer,
wherein the electric conductive area has a curved shape in a plane parallel with the substrate with an electric conductive layer arranged therein, and the electric conductive layer has a curved arrangement in the plane within the electric conductive area, and wherein the electric conductive layer is connected with the electronic device integration area.

2. The stretchable electrode according to claim 1 wherein, the second elastic layer is made of material including at least one of polyimide (PI), polycarbonate (PC), polymethyl methacrylate (PMMA) and polyethylene terephthalate (PET).

3. The stretchable electrode according to claim 2, wherein, the second elastic layer has a thickness range from 5 μm to 30 μm.

4. The stretchable electrode according to claim 2, wherein, the electric conductive layer is a metal wire having a width equal to that of the electric conductive area.

5. The stretchable electrode according to claim 4, wherein,
the metal wire comprises rectilinear segments and a curvilinear segment;
the curvilinear segment is connected between neighboring rectilinear segments, and
the curvilinear segment comprises at least one U-shaped structure formed in the plane parallel with the substrate.

6. The stretchable electrode according to claim 5, wherein, when the curvilinear segment comprises two or more U-shaped structures, two neighboring U-shaped structures have opposite protruding directions.

7. The stretchable electrode according to claim 5, wherein, the electronic device integration area is located at a location where the rectilinear segments of two of the metal wires intersect with each other.

8. The stretchable electrode according to claim 7, wherein, the two rectilinear segments at the location of intersection are made of the same metal.

9. The stretchable electrode according to claim 4, wherein, the electric conductive layer has a thickness range from 100 nm to 2 μm.

10. The stretchable electrode according to claim 4, wherein, the metal wire has a width smaller than that of the substrate.

11. The stretchable electrode according to claim 1, wherein, the electric conductive area and the electronic device integration area are both formed on the substrate, and the electric conductive area has a zone overlapping the electronic device integration area.

12. The stretchable electrode according to claim 1, wherein, the electric conductive area is partially formed on the substrate, and the electronic device integration area is entirely formed on the substrate.

13. The stretchable electrode according to claim 12, wherein, the part of the electric conductive area formed on the substrate is a zone where the electric conductive area overlaps the electronic device integration area.

14. The stretchable electrode according to claim 1, wherein, the electronic device integration area is formed as a first groove provided on the substrate; the electric conductive area is formed as a second groove having a curved shape; and the second groove intersects with the first groove and has a groove bottom lower than that of the first groove.

15. The stretchable electrode according to claim 1, further comprising:
an insulating layer, provided on the electric conductive layer, covering the electric conductive layer, and having welding through-holes provided therein;

a welding pad, formed on the insulating layer, filled in the welding through-holes, and connected to the electric conductive layer.

16. An electronic device, comprising the stretchable electrode according to claim 1.

17. The electronic device according to claim 16, wherein,
an electronic device body is integrated in the electronic device integration area and is in contact with the electric conductive layer; and
the electronic device further comprises a third elastic layer, covering on the electronic device body and being in contact with the first elastic layer or the second elastic layer, so as to encapsulate the electronic device body.

18. The electronic device according to claim 16, wherein the electric conductive layer comprises rectilinear segments and a curvilinear segment;
the curvilinear segment is connected between neighboring rectilinear segments, and
the curvilinear segment comprises at least one U-shaped structure formed in the plane parallel with the substrate.

19. The electronic device according to claim 18, wherein when the curvilinear segment comprises two or more U-shaped structures, two neighboring U-shaped structures have opposite protruding directions.

20. The electronic device according to claim 16, wherein the electric conductive area is partially formed on the substrate, and the electronic device integration area is entirely formed on the substrate, the part of the electric conductive area formed on the substrate is a zone where the electric conductive area overlaps the electronic device integration area.

\* \* \* \* \*